United States Patent
Zang et al.

(10) Patent No.: US 9,773,680 B1
(45) Date of Patent: Sep. 26, 2017

(54) ADVANCED METHOD FOR SCALED SRAM WITH FLEXIBLE ACTIVE PITCH

(71) Applicant: GLOBALFOUNDRIES Inc., Grand Cayman (KY)

(72) Inventors: Hui Zang, Guilderland, NY (US); Jinping Liu, Ballston Lake, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/377,503

(22) Filed: Dec. 13, 2016

(51) Int. Cl.
H01L 21/311 (2006.01)
H01L 21/3065 (2006.01)
H01L 29/66 (2006.01)
H01L 21/02 (2006.01)
H01L 21/308 (2006.01)
H01L 27/11 (2006.01)

(52) U.S. Cl.
CPC .... H01L 21/3065 (2013.01); H01L 21/02532 (2013.01); H01L 21/02592 (2013.01); H01L 21/3081 (2013.01); H01L 21/3085 (2013.01); H01L 27/1104 (2013.01); H01L 29/66553 (2013.01)

(58) Field of Classification Search
USPC ........................................................ 438/703
See application file for complete search history.

(56) References Cited

U.S. PATENT DOCUMENTS

| 9,287,135 | B1* | 3/2016 | Doris | H01L 21/31144 |
| 2012/0235247 | A1* | 9/2012 | Cai | H01L 21/3086 257/392 |
| 2014/0083972 | A1* | 3/2014 | Oyama | H01B 13/003 216/13 |

* cited by examiner

*Primary Examiner* — Timor Karimy
(74) *Attorney, Agent, or Firm* — Heslin Rothenberg Farley & Mesiti P.C.; Nathan B. Davis

(57) ABSTRACT

Devices and methods of fabricating scaled SRAM with flexible active pitch are provided. One method includes, for instance: obtaining an intermediate semiconductor device having a first portion and a second portion, including a plurality of layers and a patterned mandrel; forming a first set of spacers surrounding the patterned mandrel; etching the dielectric layer; depositing a photoresist layer; opening the photoresist layer over the first portion and not the second portion, removing the patterned mandrel in the open areas; etching the dielectric layer in the open areas; removing the photoresist layer, the remaining patterned mandrels, and the first set of spacers in the first and second portion, etching the silicon layer and MTO layer to form a pattern; forming a second set of spacers around the pattern; and etching a set of fins into the substrate and oxide layer.

13 Claims, 15 Drawing Sheets

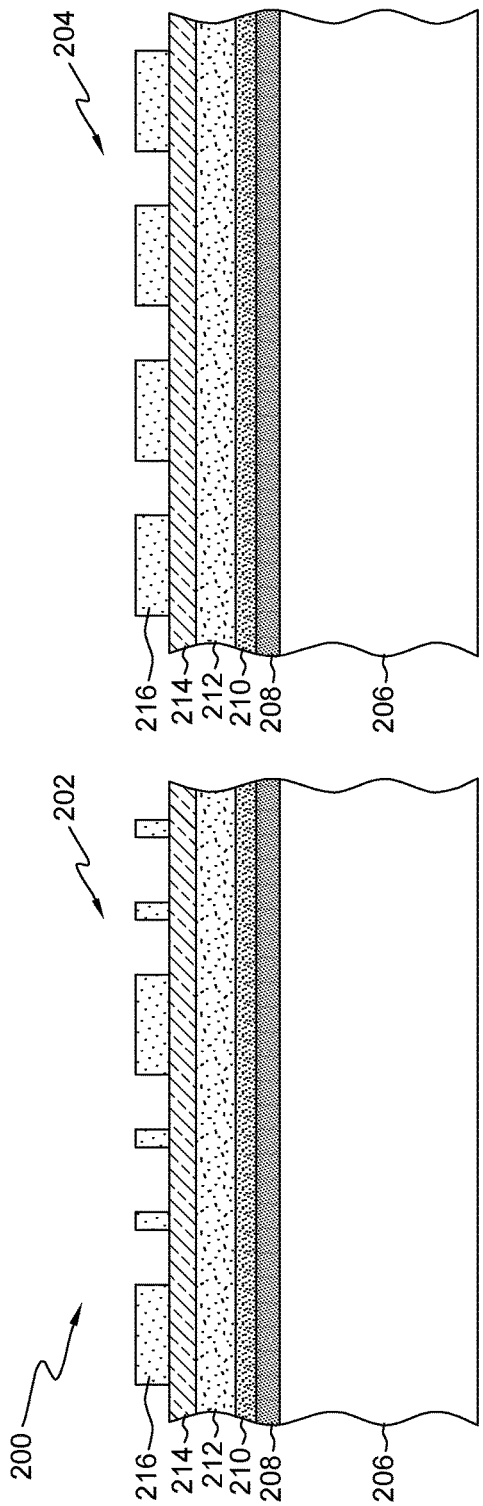
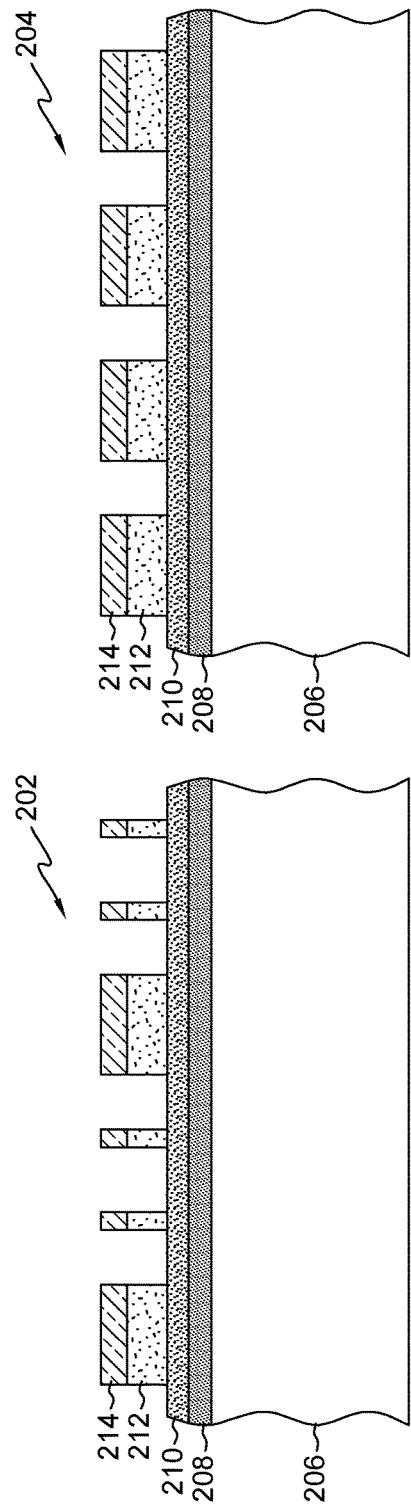
FIG. 12
FIG. 13

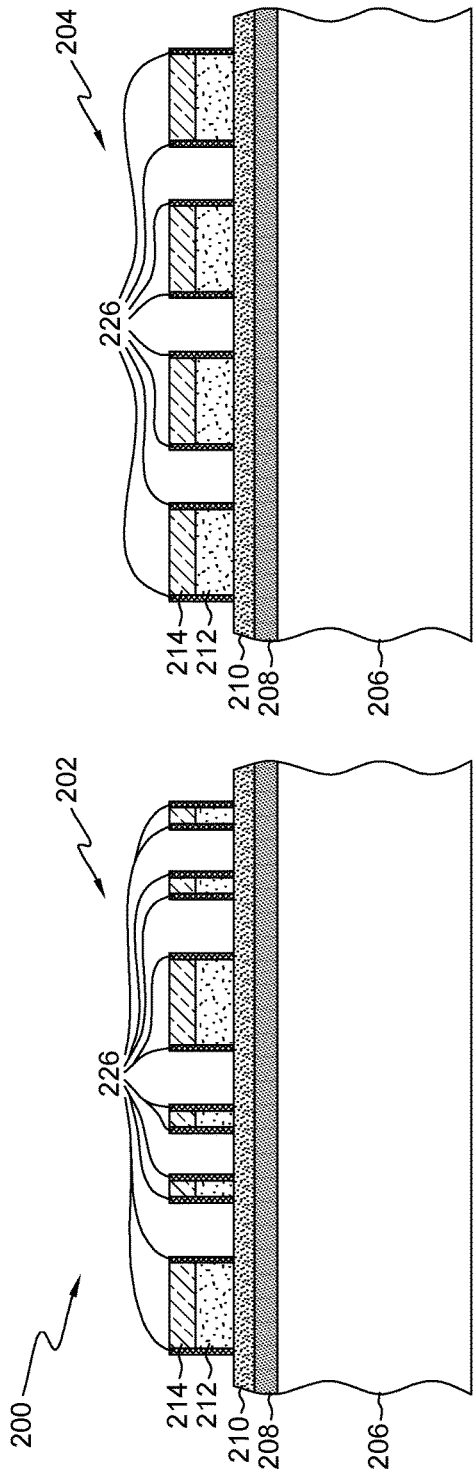
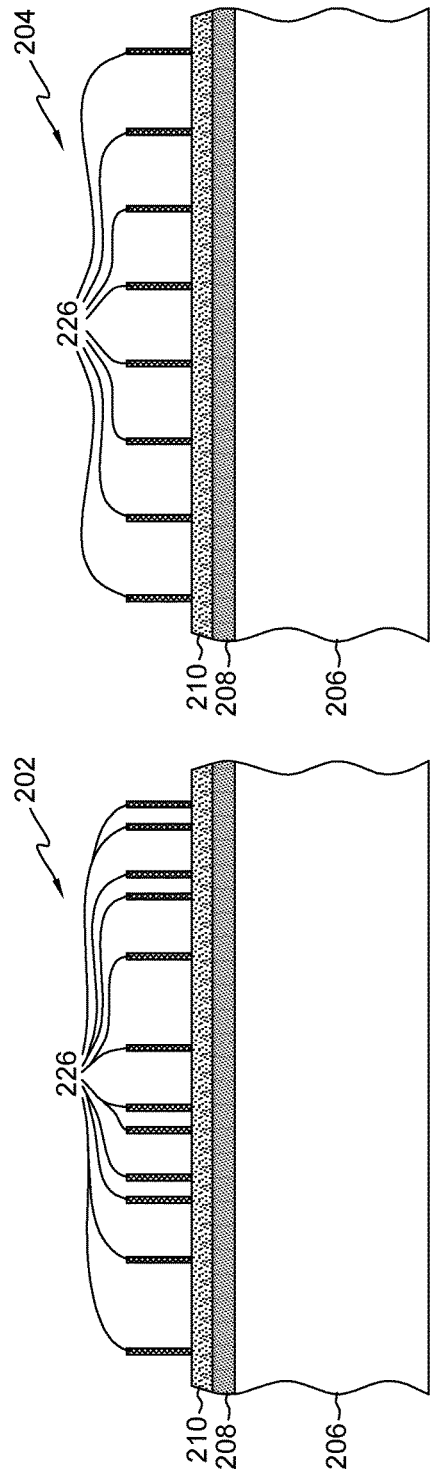

ADVANCED METHOD FOR SCALED SRAM WITH FLEXIBLE ACTIVE PITCH

FIELD OF THE INVENTION

The present invention relates to semiconductor devices and methods of fabricating semiconductor devices, and more particularly, to devices and methods of forming a variable Fin pitch on an SRAM device.

BACKGROUND OF THE INVENTION

For SRAM cells, as the size of the cell shrinks, the Fin pitch scaling requires new processes to advance beyond the 14 nm node. This is made difficult as it requires self-aligned quadruple patterning (SAQP) and self-aligned double patterning (SADP), which are not always compatible. In order to reach 10 nm and 7 nm node sizes, current methods cannot scale the fin pitch small enough.

Therefore, it may be desirable to develop methods of fabricating semiconductor devices with a reduced, variable Fin pitch.

BRIEF SUMMARY

The shortcomings of the prior art are overcome and additional advantage are provided through the provisions, in one aspect, a method that includes, for instance: obtaining an intermediate semiconductor device having a first portion and a second portion and including a substrate, an oxide layer, a nitride layer, a middle temperature oxide (MTO) layer, a silicon layer, a dielectric layer, and a patterned mandrel; forming a first set of spacers vertically surrounding the patterned mandrel; etching the dielectric layer using the patterned mandrel and the first set of spacers as a mask; depositing a photoresist layer over the first portion and the second portion; opening the photoresist layer over a set of the patterned mandrels of the first portion and not the second portion and removing the patterned mandrel in the open areas; etching the dielectric layer in the open areas; removing the photoresist layer, the remaining patterned mandrels, and the first set of spacers in the first portion and the second portion and etching the silicon layer and MTO layer to form a pattern; forming a second set of spacers around the pattern; and etching a set of fins into the silicon and oxide layers.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 12 depicts the device of FIG. 11 after removing the first set of spacers in the first portion and the second portion, in accordance with one or more aspects of the present invention;

FIG. 13 depicts the device of FIG. 12 after etching the silicon layer and MTO layer to form a pattern, in accordance with one or more aspects of the present invention;

FIG. 14 depicts the device of FIG. 13 after forming a second set of spacers around the pattern, in accordance with one or more aspects of the present invention;

FIG. 15 depicts the device of FIG. 14 after removing the MTO layer and the silicon layer between the second set of spacers, in accordance with one or more aspects of the present invention;

DETAILED DESCRIPTION

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure. Note also that reference is made below to the drawings, which are not drawn to scale for ease of understanding, wherein the same reference numbers used throughout different figures designate the same or similar components.

Generally stated, disclosed herein are certain integrated circuits, which provide advantages over the above noted, existing semiconductor devices and fabrication processes. Advantageously, the integrated circuit device fabrication processes disclosed herein provide for semiconductor devices with a scaled SRAM with a flexible pitch.

Figure 1:
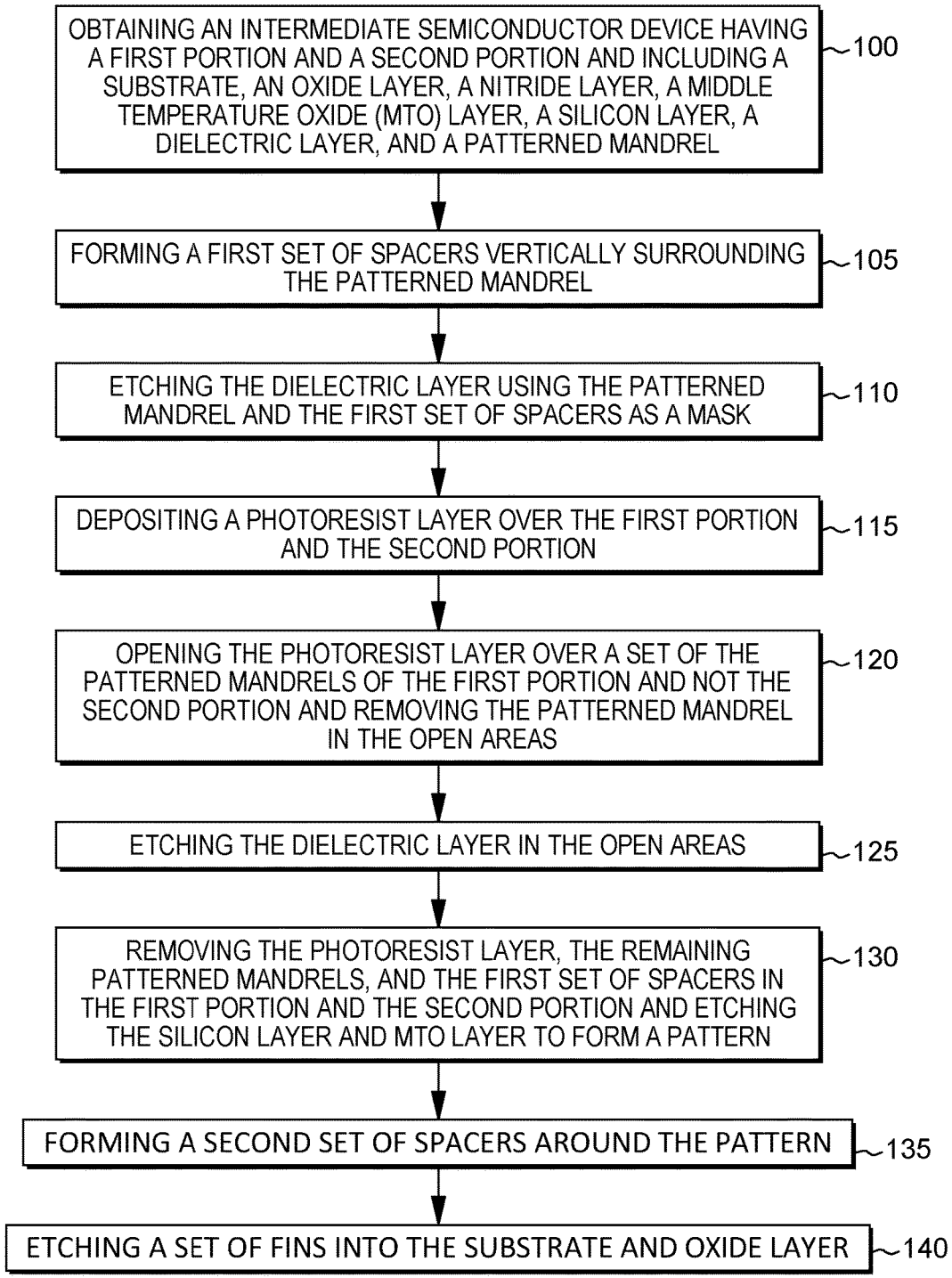
FIG. 1 depicts a flow diagram describing one embodiment of a method, in accordance with one or more aspects of the present invention.

In one aspect, in one embodiment, as shown in FIG. 1, an integrated circuit device formation process in accordance with one or more aspects of the present invention may include, for instance: obtaining an intermediate semiconductor device having a first portion and a second portion and including a substrate, an oxide layer, a nitride layer, a middle temperature oxide (MTO) layer, a silicon layer, a dielectric layer, and a patterned mandrel 100; forming a first set of spacers vertically surrounding the patterned mandrel 105; etching the dielectric layer using the patterned mandrel and the first set of spacers as a mask 110; depositing a photoresist layer over the first portion and the second portion 115; opening the photoresist layer over a set of the patterned mandrels of the first portion and not the second portion and removing the patterned mandrel in the open areas 120; etching the dielectric layer in the open areas 125; removing the photoresist layer, the remaining patterned mandrels, and the first set of spacers in the first portion and the second portion and etching the silicon layer and MTO layer to form a pattern 130; forming a second set of spacers around the pattern 135; and etching a set of fins into the substrate and oxide layer 140.

FIGS. 2-16 depict, by way of example only, one detailed embodiment of a portion of an intermediate semiconductor device formation process and a portion of an intermediate semiconductor structure, in accordance with one or more aspects of the present invention. Note that these figures are not drawn to scale in order to facilitate understanding of the invention, and that the same reference numerals used throughout different figures designate the same or similar elements.

Figure 2:
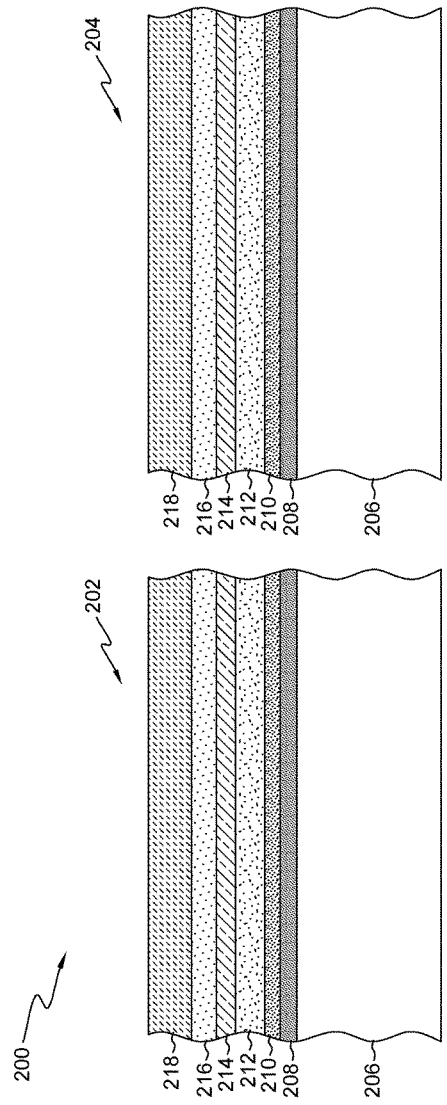
FIG. 2 depicts a cross-sectional elevation view of one embodiment of a method of fabricating an intermediate semiconductor device having a first portion and a second portion and including a substrate, an oxide layer, a nitride layer, a middle temperature oxide (MTO) layer, a silicon layer, a dielectric layer, and a mandrel, in accordance with one or more aspects of the present invention.

FIG. 2 shows a portion of an intermediate semiconductor device generally denoted 200, depicted at an intermediate semiconductor fabrication stage. The device 200 may have been processed through initial device processing steps in accordance with the design of the device 200 being fabricated. For example, the device 200 may include, for instance, a first portion 202 and a second portion 204, each having different requirements including but not limited to self-aligned quadruple patterning (SAQP) patterning, self-aligned double patterning (SADP) patterning, or a combination of both. Previous attempts are incapable of patterning both or a combination of them simultaneously due to the narrow pitch between lines, which may be 80 nm or less. In previous attempts, trying to combine SAQP and SADP patterning results in partial cuts necessary and overlay issues for the cuts. In embodiments disclosed herein, both can be patterned differently at the same time. The first portion 202 and the second portion 204 may be included on the same chip, and may be separated by any distance, and the orientation is not intended to be limiting. In some embodiments, the first portion 202 includes a P80 region and the second portion 204 includes a P64 region. There may be a plurality of each of the first portion 202 and the second portion 204. The device 200 can include, on both the first portion 202 and the second portion 204, a substrate 206. The substrate 206 may be any suitable material, for example, silicon.

In another embodiment (not shown), the substrate of device 200 may be, for example, a silicon on insulator (SOI) substrate (not shown). For example, the SOI substrate may include an isolation layer (not shown), which may be a local buried oxide region (BOX) or any suitable material for electrically isolating transistors, aligned with the gate structure. In some embodiments, the device is a portion of a front end of line (FEOL) portion of an integrated circuit (IC).

Still referring to FIG. 2, above substrate 206 may be a plurality of layers. For instance, an oxide layer 208 may be above substrate 206 and can include any oxide materials now known or later developed. Above this may be a nitride layer 210, including but not limited to silicon nitride. A middle temperature oxide (MTO) layer 212 may be disposed above the nitride layer 210. A silicon layer 214 and a dielectric layer 216 can be disposed over MTO layer 212. The dielectric layer 216 can include any dielectric, including but not limited to silicon nitride, and allows for an extra patterning etch to be used to facilitate the simultaneous patterning described throughout. A mandrel 218 may be deposited above the plurality of layers, the mandrel 218 including an amorphous silicon layer.

Figure 3:
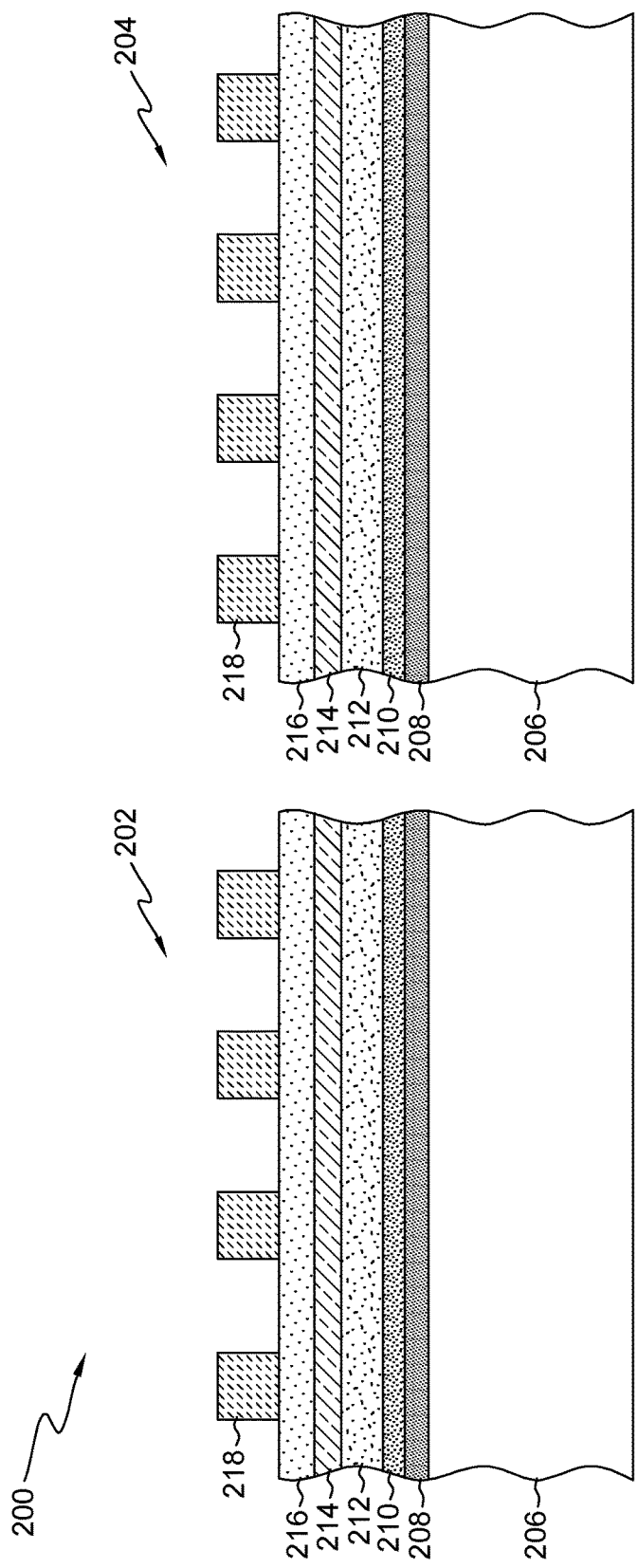
FIG. 3 depicts the structure of FIG. 2 after patterning the mandrel into a patterned mandrel, in accordance with one or more aspects of the present invention.

As depicted in FIG. 3, the mandrel layer 218 can be patterned in a way typical of an SADP process. The patterning can include blocks at any distance required for the final fin formation from the patterning.

Figure 4:
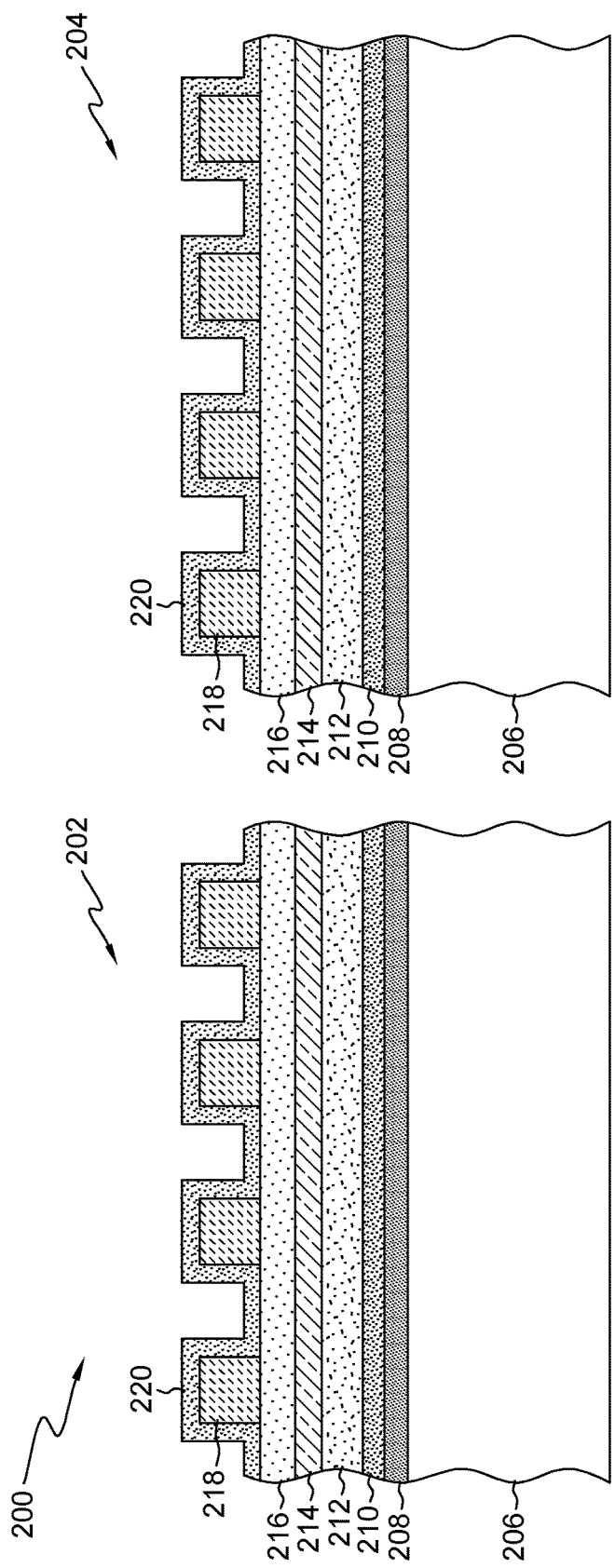
FIG. 4 depicts the structure of FIG. 3 after depositing a first spacer layer conformally over the dielectric layer and the patterned mandrel, in accordance with one or more aspects of the present invention.
Figure 5:
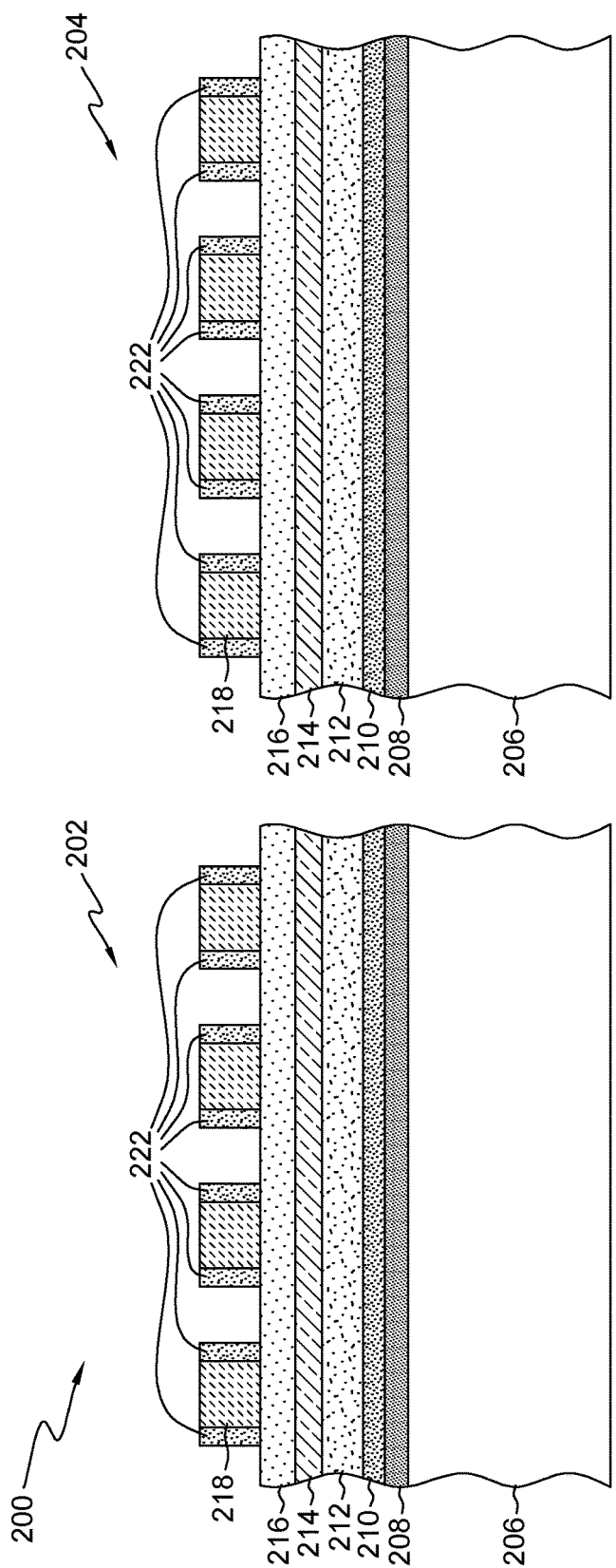
FIG. 5 depicts the structure of FIG. 4 after etching the first spacer layer leaving a first set of spacers vertically surrounding the patterned mandrel, in accordance with one or more aspects of the present invention.

As depicted in FIG. 4, a first spacer layer 220, in some embodiments an oxide material, may be deposited conformally over the exposed dielectric layer 216 and the patterned mandrel 218. In FIG. 5, the first spacer layer 220 is etched back, for instance using reactive ion etching (RIE), in order to define a first set of spacers 222, vertically surrounding the outside edges of the patterned mandrel 218 on both the first portion 202 and the second portion 204.

Figure 6:
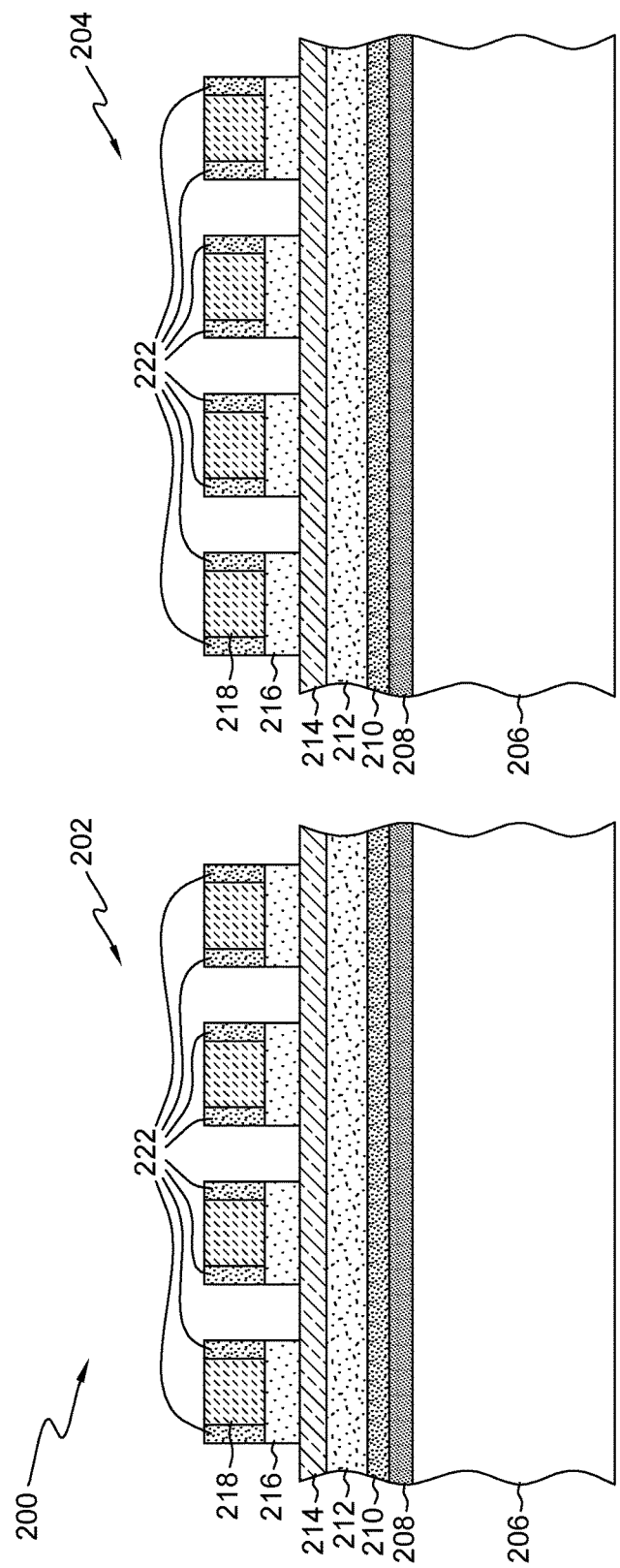
FIG. 6 depicts the structure of FIG. 5 after etching the dielectric layer using the patterned mandrel and the first set of spacers as a mask, in accordance with one or more aspects of the present invention.

As depicted in FIG. 6, using the first set of spacers 222 and the patterned mandrel 218 as a mask, the dielectric layer 216 is etched, removing the dielectric material between adjacent spacers of the first set of spacers 222. This etch may be the same etch used to etch back the first spacer layer 220 and continue until the dielectric layer 216 is etched down to the silicon layer 214.

Figure 7:
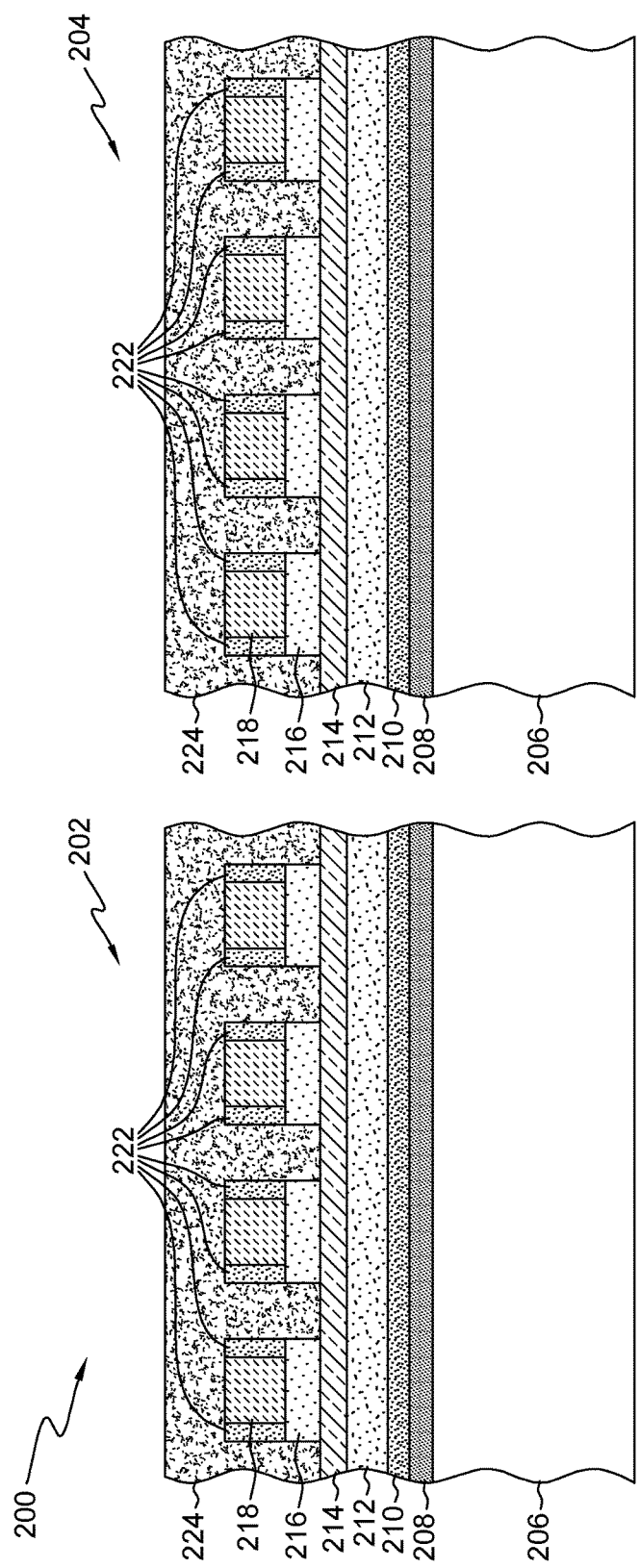
FIG. 7 depicts the structure of FIG. 6 after depositing a photoresist layer over the first portion and the second portion, in accordance with one or more aspects of the present invention.
Figure 8:
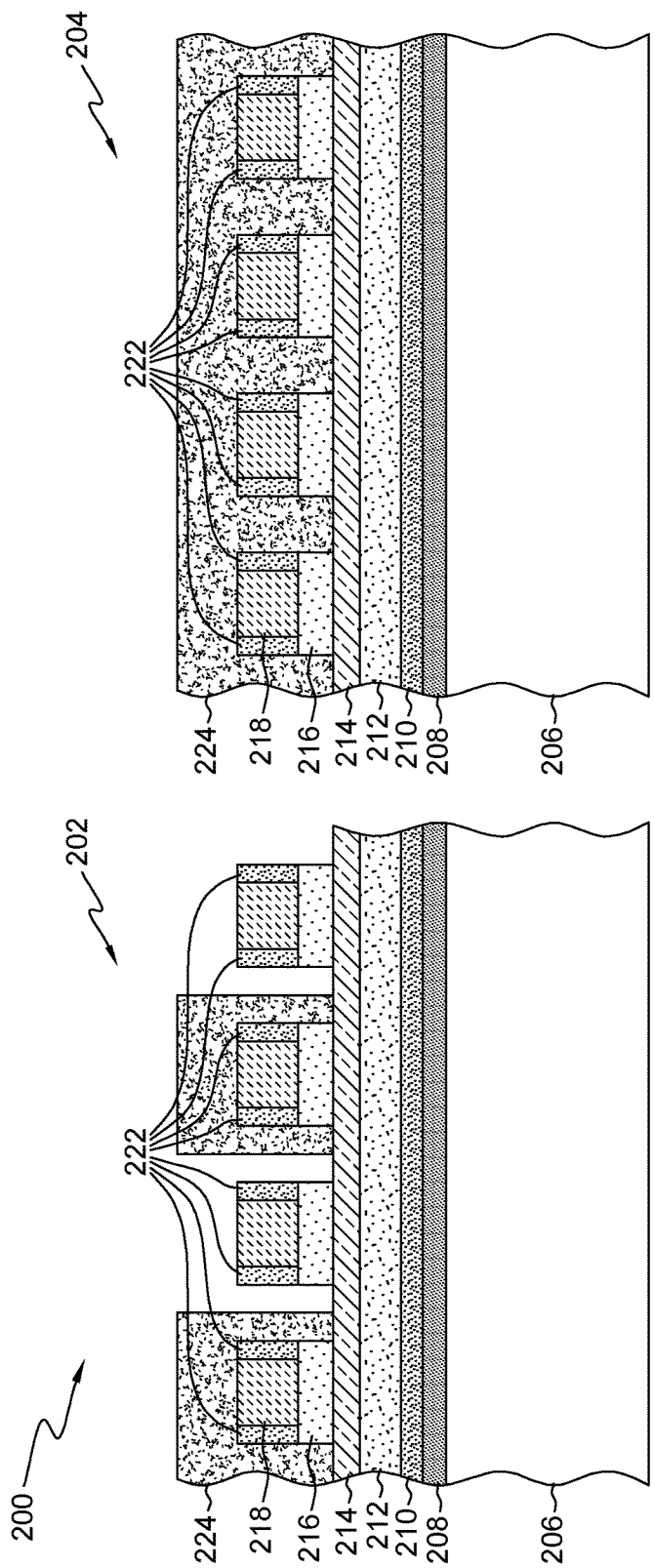
FIG. 8 depicts the structure of FIG. 7 after opening the photoresist layer over a set of the patterned mandrels of the first portion and not the second portion, in accordance with one or more aspects of the present invention.

As depicted in FIG. 7, a photoresist layer 224 is deposited over both the first portion 202 and the second portion 204, covering all existing elements of device 200. As depicted in FIG. 8, the photoresist layer 224 can be opened, for instance, over a set of the patterned mandrels 218 of the first portion 202, and not opened over any of the patterned mandrels 218 of the second portion. As shown, the set of patterned mandrels 218 over which the photoresist layer 224 is opened can include every other patterned mandrel 218 and the connected first set of spacers 222. This is not intended to be limiting, rather, any mandrels that require SAQP patterning may be opened, and any that require SADP patterning can be covered by the photoresist layer 224. The opening of the photoresist layer 224 can be accomplished using known lithographic techniques.

Figure 9:
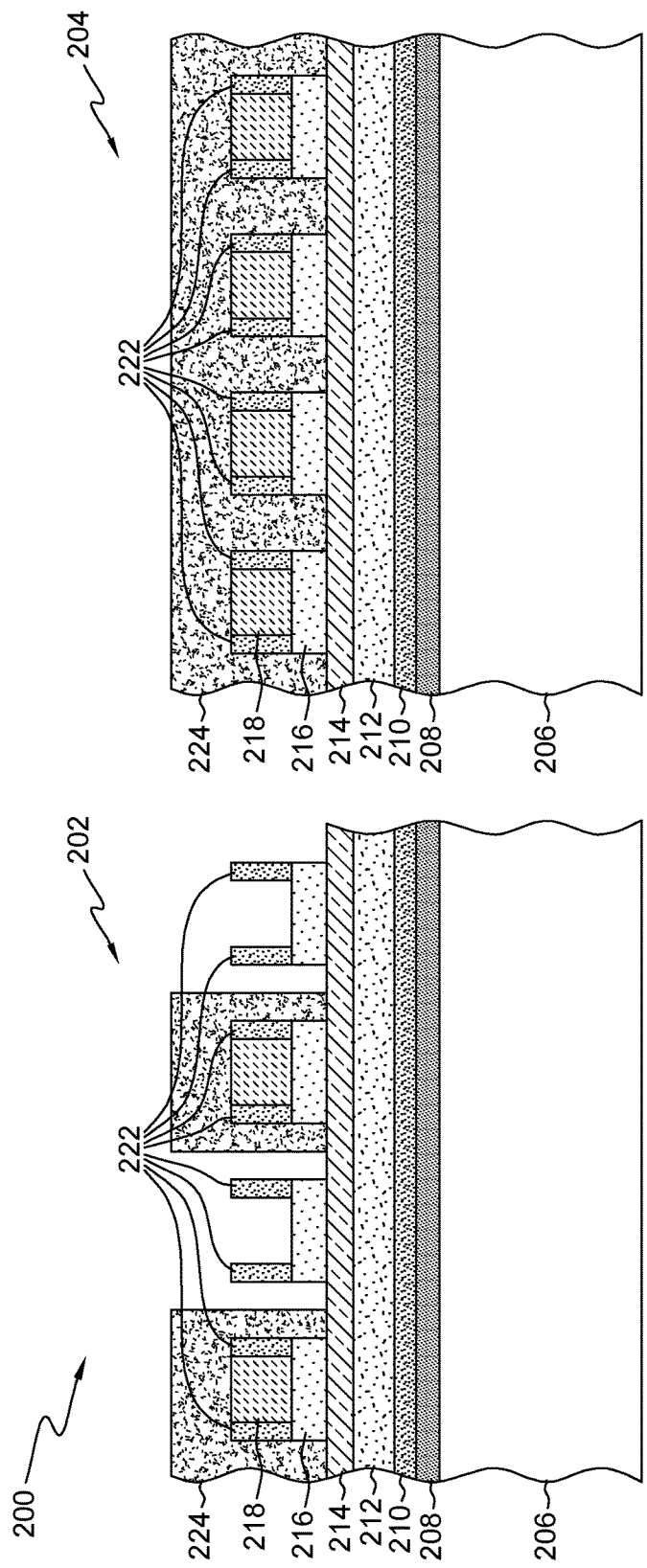
FIG. 9 depicts the structure of FIG. 8 after removing the patterned mandrel in the open areas of the first portion, in accordance with one or more aspects of the present invention.
Figure 10:
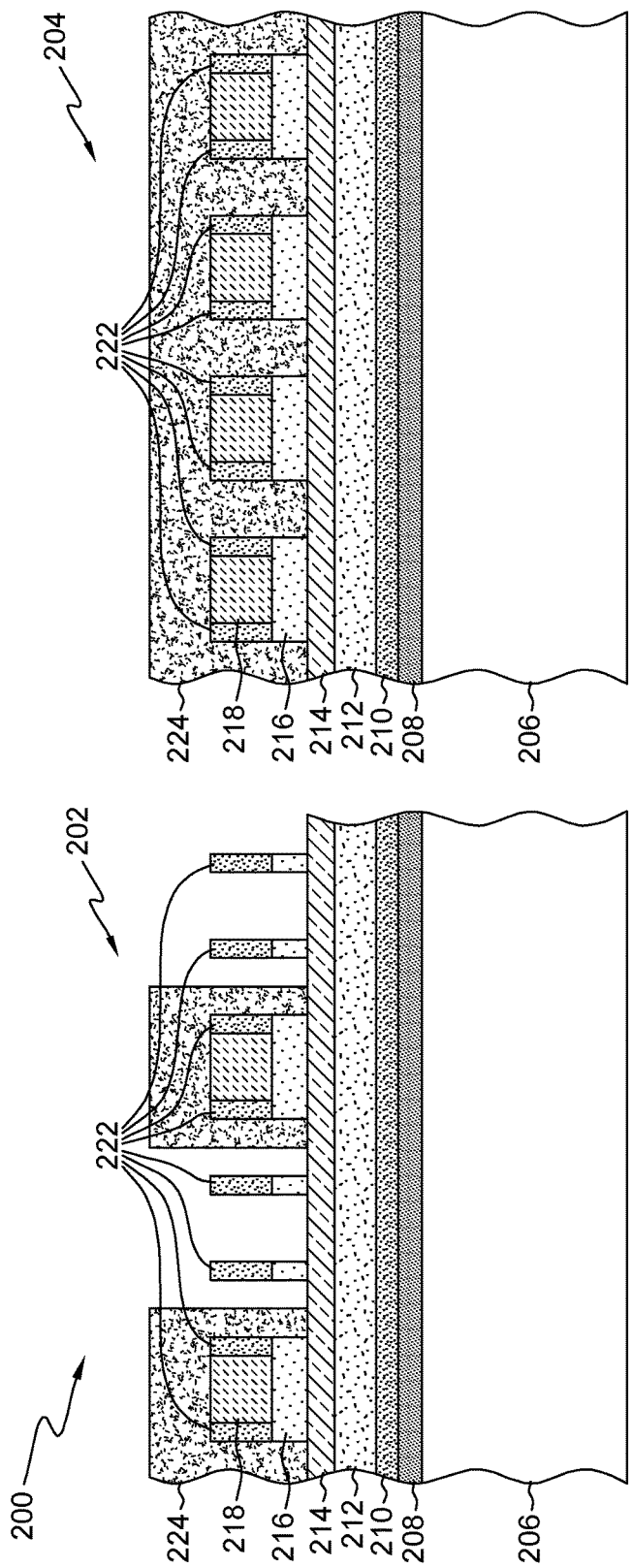
FIG. 10 depicts the structure of FIG. 9 after etching the dielectric layer in the open areas of the first portion, in accordance with one or more aspects of the present invention.

As depicted in FIG. 9, any exposed patterned mandrels 218 may be removed via a mandrel etch, and the patterned mandrels covered by photoresist layer 224 will remain intact. FIG. 10 illustrates the etching of the exposed dielectric layer 216 between first set of spacers 222 exposed during the opening of the photoresist layer 224. Since the photoresist layer 224 is continuous over the second portion 204, no changes are made during these steps to the second portion 204. However, if some SAQP patterning were required on the second portion 204, but different from the patterning of the first portion 202, some areas of the second portion 204 could be opened and further patterned.

Figure 11:
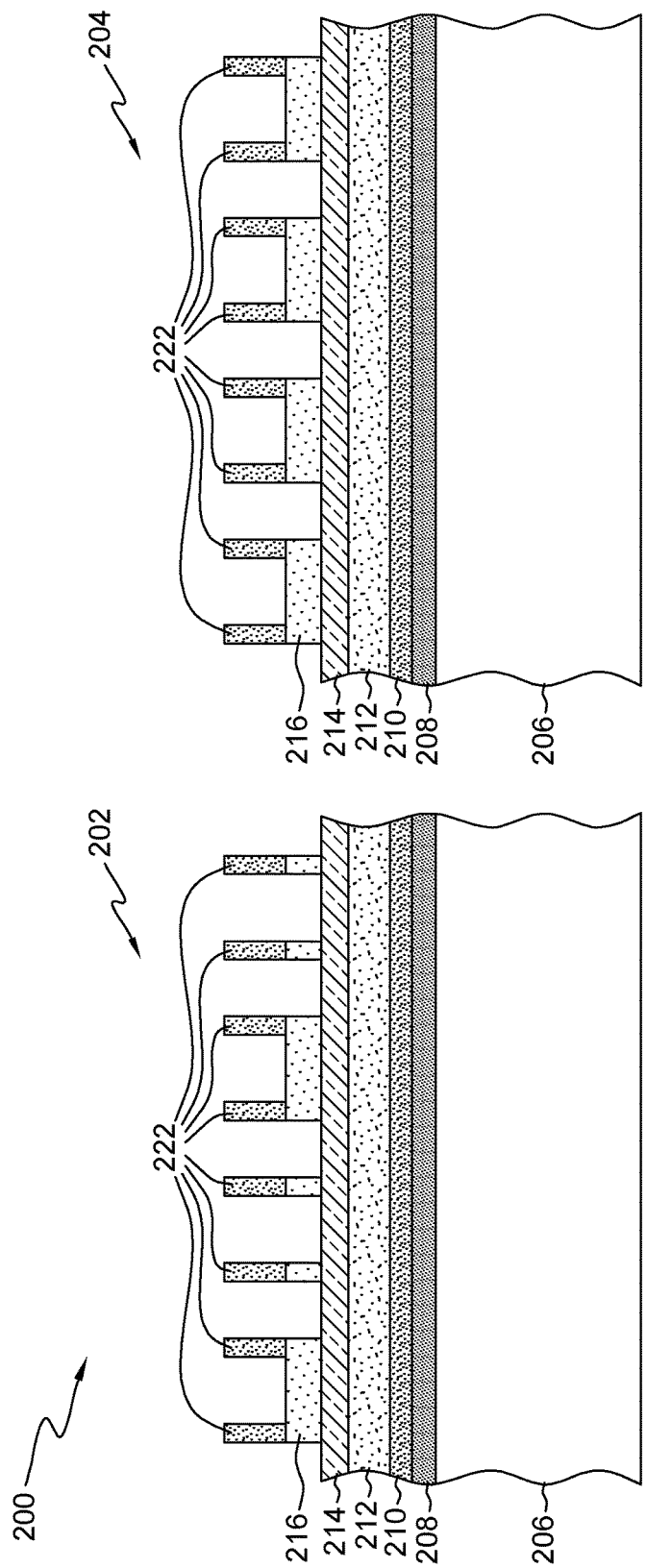
FIG. 11 depicts the device of FIG. 10 removing the photoresist layer and the remaining patterned mandrels in the first portion and the second portion, in accordance with one or more aspects of the present invention.

As depicted in FIG. 11, any photoresist layer 224 remaining, both over the first portion 202 and the second portion 204, may be removed by a photoresist strip technique. Simultaneously or separately, the remaining patterned mandrels 218 may also be removed by a mandrel pull or a silicon etch process. Following this, as illustrated in FIG. 12, the first set of spacers 222 may be removed via selective etching or oxide etching.

As depicted in FIG. 13, using the remaining dielectric layer 216 as a mask, the silicon layer 214 and the MTO layer 212 may be etched, for instance, by RIE in order to carry the pattern formed in the dielectric layer 216 down to the nitride layer 210. As depicted in FIG. 14, a second set of spacers 226 may be formed around the pattern, that is, vertically around the MTO layer 212 and the silicon layer 214 remaining. Although not shown, it should be understood that, similar to FIGS. 4-5, the second set of spacers 226 may be formed by depositing a second spacer layer conformally over the nitride layer 210 and the pattern in the MTO layer 212 and the silicon layer 214. This conformal layer may then be etched back via RIE leaving the second set of spacers vertically surrounding the pattern in the MTO layer 212 and the silicon layer 214.

Figure 16:
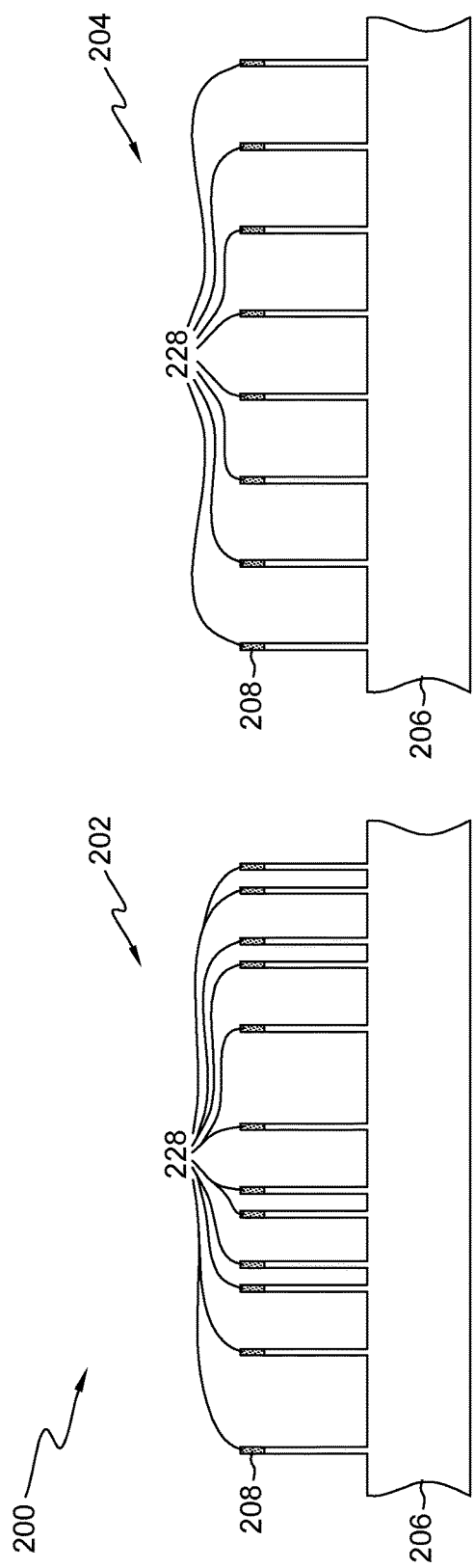
FIG. 16 depicts the device of FIG. 15 after etching a set of fins into the substrate and oxide layer, in accordance with one or more aspects of the present invention.
Figure 17:
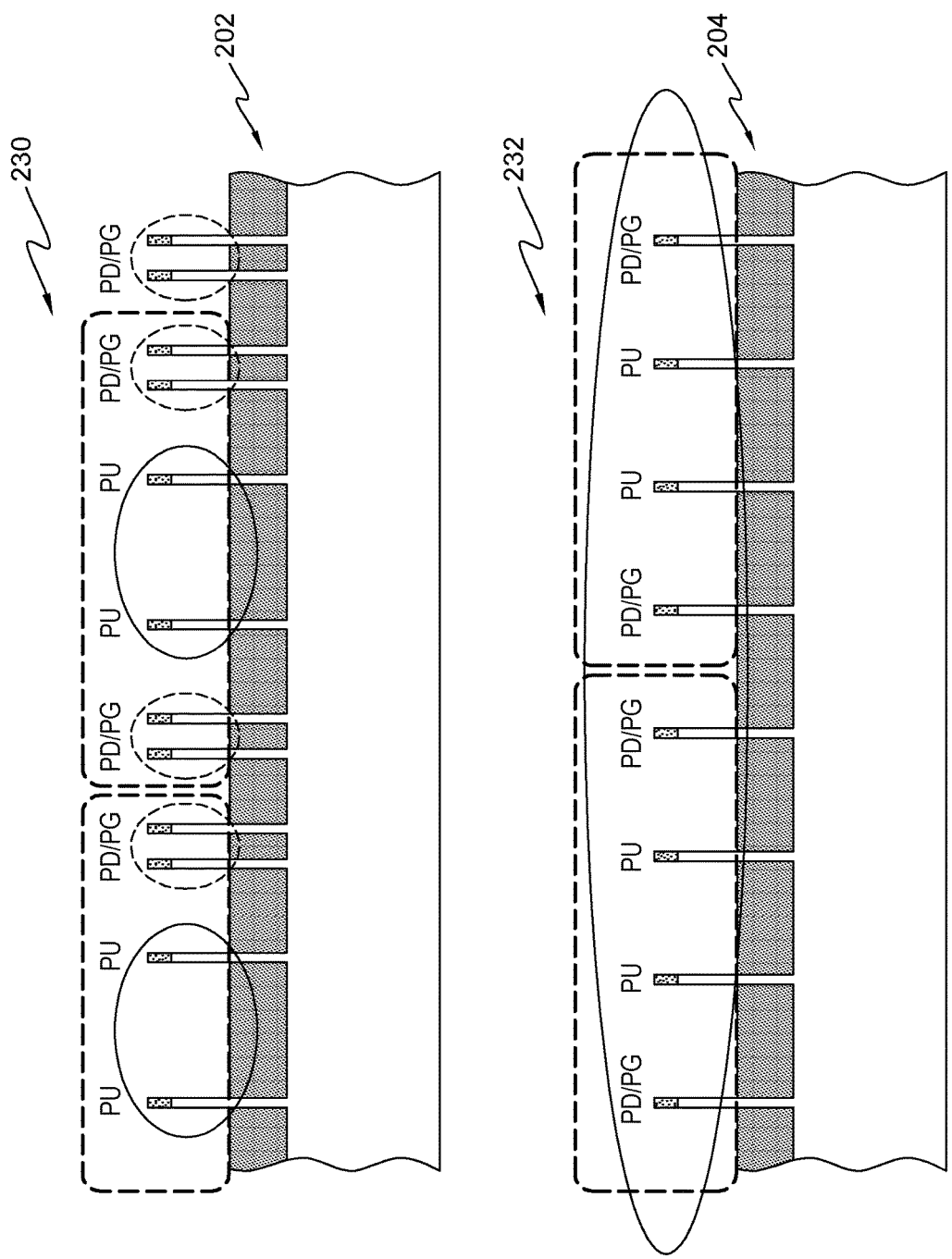
FIG. 17 depicts the device of FIG. 16 after formation of the device, illustrating the SAQP and SADP regions, in accordance with one or more aspects of the present invention.

As depicted in FIG. 15, the MTO layer 212 and silicon layer 214 remaining between the second set of spacers 226 may be removed via etching techniques such as silicon etching and oxide etching. FIG. 16 illustrates the etching, using the second set of spacers 226 as a mask, using RIE, to remove the nitride layer 210, the oxide layer 208, and a portion of the substrate 206, leaving a set of fins 228 formed of a portion of the substrate 206 and the oxide layer 208 over the fin portions of the substrate 206. It is to be understood that the device 200 can continue through known processing steps following the formation of the set of fins 228. For instance, FIG. 17 illustrates the first portion 202 and the second portion 204 following further processing of the chip. As can be seen, the set of fins 228 of the first portion 202 include a different pattern, a first portion pattern 230, than those of second portion 204, second portion pattern 232. In some embodiments, first portion 202 can include SAQP patterning and SADP patterning, which were formed in a single process as described above. The set of fins 228 in the second portion can exhibit only SADP patterning, while also being developed in the same process as the first portion 202.

It should be appreciated that the novel intermediate semiconductor devices and methods of forming the same disclosed above allow for patterning both SAQP and SADP techniques simultaneously without overlay issues. This allows for greater scaling of SRAM devices and for a flexible, variable pitch between fins. Additionally, the combination of SAQP and SADP allow for varying fin widths in SRAM devices.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A method comprising:
    obtaining an intermediate semiconductor device having a first portion and a second portion and including a substrate, an oxide layer, a nitride layer, a middle temperature oxide (MTO) layer, a silicon layer, a dielectric layer, and a patterned mandrel;
    forming a first set of spacers vertically surrounding the patterned mandrel;
    etching the dielectric layer using the patterned mandrel and the first set of spacers as a mask;
    depositing a photoresist layer over the first portion and the second portion;
    opening the photoresist layer over a set of the patterned mandrels of the first portion and not the second portion and removing the patterned mandrel in the open areas;
    etching the dielectric layer in the open areas;
    removing the photoresist layer, the remaining patterned mandrels, and the first set of spacers in the first portion and the second portion and etching the silicon layer and MTO layer to form a pattern;
    forming a second set of spacers around the pattern; and
    etching a set of fins into the substrate and oxide layer.

2. The method of claim 1, wherein the forming the first set of spacers further comprises:
    depositing a first spacer layer conformally over the dielectric layer and the patterned mandrel;
    etching the first spacer layer leaving the first set of spacers vertically surrounding the patterned mandrel.

3. The method of claim 1, wherein the removing further comprises:
    removing the photoresist layer with a photoresist strip process;
    removing the remaining mandrels with a silicon etch; and
    removing the first set of spacers with an oxide etch.

4. The method of claim 3, wherein the etching the silicon layer and MTO layer further comprises:
  using the dielectric layer as a mask to reactive ion etch (RIE) through the dielectric layer, the silicon layer, and the MTO layer to form the pattern in the MTO layer and the silicon layer.

5. The method of claim 1, wherein the forming second set of spacers further comprises:
  depositing a second spacer layer conformally over the nitride layer and the pattern in the MTO layer and the silicon layer;
  etching the second spacer layer leaving the second set of spacers vertically surrounding the pattern in the MTO layer and the silicon layer.

6. The method of claim 1, wherein the etching a set of fins further comprises:
  removing the MTO layer and the silicon layer between the second set of spacers; and
  using RIE to etch away the nitride layer, the oxide layer, and a portion of the substrate, leaving the set of fins in the substrate and the oxide layer.

7. The method of claim 1, wherein the set of fins comprises two distinct patterns including a first portion pattern over the first portion of the intermediate semiconductor device and a second portion pattern over the second portion of the intermediate semiconductor device.

8. The method of claim 7, wherein the first portion pattern comprises a self-aligned quadruple pattern (SAQP) and the second portion pattern comprises a self-aligned double pattern (SADP).

9. The method of claim 8, wherein the first portion comprises a P80 region and the second portion comprises a P64 region.

10. The method of claim 1, wherein the patterned mandrel comprises amorphous silicon.

11. The method of claim 1, wherein the dielectric layer comprise an oxide material or silicon nitride.

12. The method of claim 1, wherein the first set of spacers comprises an oxide material.

13. The method of claim 1, wherein the second set of spacers comprises an oxide material or silicon nitride.

* * * * *